United States Patent [19]

Ayai et al.

[11] Patent Number: 5,628,836
[45] Date of Patent: May 13, 1997

[54] METHOD OF PREPARING NB₃AL SUPERCONDUCTING WIRE

[75] Inventors: Naoki Ayai; Yuichi Yamada, both of Osaka, Japan

[73] Assignee: Sumitomo Electric Industries, Ltd., Japan

[21] Appl. No.: 342,276

[22] Filed: Nov. 18, 1994

[30] Foreign Application Priority Data

Nov. 19, 1993 [JP] Japan .................. 5-290714

[51] Int. Cl.⁶ .................. H01L 39/24; H01B 12/00
[52] U.S. Cl. .................. 148/98; 427/62; 427/120; 505/813; 505/918; 29/599
[58] Field of Search ........ 427/62, 120; 505/813, 505/918; 29/599; 148/98

[56] References Cited

U.S. PATENT DOCUMENTS

| | | | |
|---|---|---|---|
| 4,078,299 | 3/1978 | Furuto et al. .................. | 29/599 |
| 4,088,512 | 5/1978 | Pickus et al. . | |
| 4,391,657 | 7/1983 | Feldmann et al. .................. | 148/133 |
| 4,917,965 | 4/1990 | Inoue et al. . | |
| 5,362,331 | 11/1994 | Tada et al. .................. | 148/98 |

FOREIGN PATENT DOCUMENTS

| | | |
|---|---|---|
| 0405405A2 | 1/1991 | European Pat. Off. . |
| 0528036A1 | 2/1993 | European Pat. Off. . |
| 2265159 | 10/1975 | France . |

*Primary Examiner*—Roy V. King
*Attorney, Agent, or Firm*—Pennie & Edmonds

[57] ABSTRACT

The method of preparing an Nb₃Al superconducting wire comprises the steps of passing an Nb/Al composite wire consisting of an Nb metal or an Nb alloy and an Al metal or an Al alloy through a furnace for heating the same from the room temperature to a prescribed temperature, subsequently passing the same through the furnace for holding the same at the prescribed temperature, and subsequently passing the same through a cooling part for cooling the same from the prescribed temperature to the room temperature, and these steps are continuously carried out by continuously moving the wire. According to the present invention, it is possible to obtain an Nb₃Al superconducting wire having homogeneous characteristics along its overall width with a high critical current density.

15 Claims, 3 Drawing Sheets

METHOD OF PREPARING $Nb_3Al$ SUPERCONDUCTING WIRE

BACKGROUND OF THE INVENTION

1. Field of the Invention

The present invention relates to methods of preparing an $Nb_3Al$ superconducting wire and an $Nb_3Al$ superconducting stranded wire, and more particularly, it relates to methods of preparing an $Nb_3Al$ superconducting wire and an $Nb_3Al$ superconducting stranded wire serving as high magnetic field superconducting materials for superconducting magnets which can be employed for nuclear fusion or the like.

2. Description of the Background Art

An $Nb_3Al$ superconducting material is expected particularly as a material for a nuclear fusion reactor which is exposed to high magnetic force in a high magnetic field, or a power storage superconducting material, due to a high critical current and excellent distortion resistance in a high magnetic field. However, it is difficult to work $Nb_3Al$, which is an intermetallic compound, into a thin wire due to inferior workability, dissimilarly to an alloy superconducting material such as an Nb-Ti material. In order to obtain an $Nb_3Al$ superconducting wire, therefore, an Nb metal and an Al metal are generally composited with each other and then drawn into a thin wire, which in turn is finally heat treated.

Further, $Nb_3Al$ is stable only under a high temperature at least 1600° C. in a binary system of Nb-Al. In order to form $Nb_3Al$ at a lower temperature, therefore, it is necessary to reduce distance of Nb and Al diffusion pairs below several 10 nm by a jelly roll method or the like.

In an Nb/Al composite material which is prepared by compositing Nb and Al metals, however, the filament is ununiformly deformed when the material is worked into a thin wire, due to inferior workability. Therefore, an $Nb_3Al$ superconducting wire which is obtained by heat treating the composite material cannot attain a sufficiently high critical current density.

Further, a compound superconducting material such as $Nb_3Al$ is coiled before a heat treatment by the so-called wind-and-react method, since its superconductivity is extremely deteriorated by distortion such as bending. When the coil as formed is increased in size, however, it is difficult to carry out a uniform heat treatment as a whole.

In order to improve superconductivity, it is preferable to form $Nb_3Al$ which is close to a stoichiometric composition and provided with fine crystal grains by performing the heat treatment in a short time at the highest possible temperature, while maintaining this $Nb_3Al$ by rapidly cooling the same to the room temperature. However, it is difficult to heat treat and cool a large-sized coil in such a manner.

SUMMARY OF THE INVENTION

In order to solve the problems of the prior art, an object of the present invention is to provide methods of preparing an $Nb_3Al$ superconducting wire and an $Nb_3Al$ superconducting stranded wire having excellent superconductivity and uniform characteristics, which can be applied to manufacturing of large-sized conductors or coils.

According to an aspect of the present invention, a method of preparing an $Nb_3Al$ superconducting wire is provided. This method comprises the steps of passing an Nb/Al composite wire consisting of an Nb metal or an Nb alloy and an Al metal or an Al alloy through a furnace for heating the same from the room temperature to a prescribed temperature, further passing the heated Nb/Al composite wire through the furnace for holding the same at the prescribed temperature, and passing the Nb/Al composite wire, which is held at the prescribed temperature, further through a cooling part for cooling the same from the prescribed temperature to the room temperature, and the step of heating the Nb/Al composite wire from the room temperature to a prescribed temperature, the step of holding the same at the prescribed temperature and the step of passing the same through said cooling part are continuously carried out by continuously moving the Nb/Al composite wire.

According to the present invention, the step of heating the Nb/Al composite wire from the room temperature to a prescribed temperature and the step of holding the wire at the prescribed temperature are continuously carried out by continuously moving the wire thereby continuously heat treating the Nb/Al composite wire. Thus, it is possible to heat treat the Nb/Al composite wire at a higher temperature in a shorter time as compared with conventional batch treatment. Consequently, it is possible to homogeneously form $Nb_3Al$ which is close to a stoichiometric composition and provided with a high grain boundary density of Nb/Al composite for serving as a pinning center along the overall length of the wire.

According to the present invention, further, the aforementioned heat treatment is continuously carried out by continuously moving the wire. Therefore, it is possible to cool the Nb/Al composite wire in a shorter time as compared with the conventional batch treatment. Consequently, it is possible to maintain high characteristics of $Nb_3Al$ which is formed in the heat treatment steps.

Preferably, the time for heating the wire from the room temperature to the prescribed temperature is within 1 minute. If this time exceeds 1 minute, it is difficult to form $Nb_3Al$ which is close to a stoichiometric composition and provided with a high grain boundary density.

Preferably, the time for cooling the wire from the prescribed temperature to the room temperature is also within 1 minute. If this time exceeds 1 minute, it is difficult to maintain high characteristics of $Nb_3Al$ as formed.

Preferably, the prescribed temperature is at least 800° C., and the time for holding the wire at the prescribed temperature is within 10 hours. In this case, it is possible to form $Nb_3Al$ which is close to a stoichiometric composition and provided with a high grain boundary density for serving as a pinning center. When the prescribed temperature is the highest possible within a range not melting a matrix and the wire is held at the prescribed temperature in a short time of several 10 seconds, it is possible to form $Nb_3Al$ having higher characteristics.

Preferably, the method further comprises a step of heating the Nb/Al composite wire, which is passed through the cooling part, at a temperature of not more than 800° C. for at least 10 hours. In this case, ununiform distortion which is applied among crystals of an $Nb_3Al$ compound phase is so relieved that it is possible to obtain an $Nb_3Al$ superconducting wire having homogeneous characteristics along its overall length with a high critical current density.

According to the present invention, it is possible to employ an Nb/Al composite wire which is composited with copper or a copper alloy for stabilization.

According to the present invention, further, it is possible to employ an Nb/Al composite wire which is prepared by a jelly roll method, while an Nb layer in the filament may have a thickness of about 500 nm.

In general, it is necessary to reduce thicknesses of an Nb layer and an Al layer in the filament to not more than several 10 nm, as hereinabove described. Therefore, it is necessary to apply severe working on the wire, leading to wire breaking. According to the present invention, on the other hand, the Nb and Al layers may have thicknesses of about 500 nm, whereby it is possible to prevent wire breaking.

According to another aspect of the present invention, a method of preparing an $Nb_3Al$ superconducting stranded wire is provided. The method comprises the steps of passing an Nb/Al composite stranded wire which is formed by stranding up a plurality of Nb/Al composite wires, each consisting of an Nb metal or an Nb alloy and an Al metal or an Al alloy, with each other through a furnace for heating the same from the room temperature to a prescribed temperature, further passing the heated Nb/Al composite stranded wire through the furnace for holding the same at the prescribed temperature, and passing the Nb/Al composite stranded wire, which is held at the prescribed temperature, further through a cooling part for cooling the same from the prescribed temperature to the room temperature, and the step of heating the Nb/Al composite stranded wire from the room temperature to a prescribed temperature, the step of holding the same at the prescribed temperature and the step of passing the same through said cooling part are continuously carried out by continuously moving the Nb/Al composite stranded wire.

Thus, it is also possible to form $Nb_3Al$ having high characteristics by continuously heat treating an Nb/Al composite stranded wire which is formed by stranding up Nb/Al composite wires by continuously moving the wire.

According to still another aspect of the present invention, a method of preparing an $Nb_3Al$ superconducting stranded wire is provided. This method comprises the steps of passing an Nb/Al composite wire consisting of an Nb metal or an Nb alloy and an Al metal or an Al alloy through a furnace for heating the same from the room temperature to a prescribed temperature, further passing the heated Nb/Al composite wire through the furnace for holding the same at the prescribed temperature, passing the Nb/Al composite wire, which is held at the prescribed temperature, further through a cooling part for cooling the same from the prescribed temperature to the room temperature, and collecting and stranding up a plurality of Nb/Al composite wires which are passed through the cooling part, and the step of heating the Nb/Al composite wire from the room temperature to a prescribed temperature, the step of holding the same at the prescribed temperature and the step of passing the same through said cooling part are continuously carried out by continuously moving the Nb/Al composite wire.

Thus, high characteristics of $Nb_3Al$ are also maintained when Nb/Al composite wires are continuously heat treated by continuously moving the wire and thereafter stranded.

Preferably, the method further comprises a step of heating the stranded wire which is formed after the heat treatment at a temperature of not more than 800° C. for at least 10 hours. In this case, ununiform distortion which is applied among crystals of an $Nb_3Al$ compound phase is so relieved that it is possible to obtain an $Nb_3Al$ superconducting stranded wire having homogeneous characteristics among strands along its overall length with a high critical current density.

According to a further aspect of the present invention, an apparatus for preparing an $Nb_3Al$ superconducting wire from an Nb/Al composite wire consisting of an Nb metal or an Nb alloy and an Al metal or an Al alloy is provided. This apparatus comprises supply/carrier means for supplying and carrying the composite wire, temperature increase means which is provided on a carrier path for heating the composite wire from the room temperature to a prescribed temperature while carrying the same, soaking/holding means which is provided on the carrier path adjacently to the temperature increase means for soaking/holding the composite wire as heated at the prescribed temperature, and cooling means which is provided on the carrier path adjacently to the soaking/holding means for cooling the composite wire as soaked/held from the prescribed temperature to the room temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

An Nb sheet and an Al sheet were lap-wound on a copper bar, and the winding as obtained was inserted in a copper pipe and thereafter drawn to have a hexagonal section.

Figure 1:
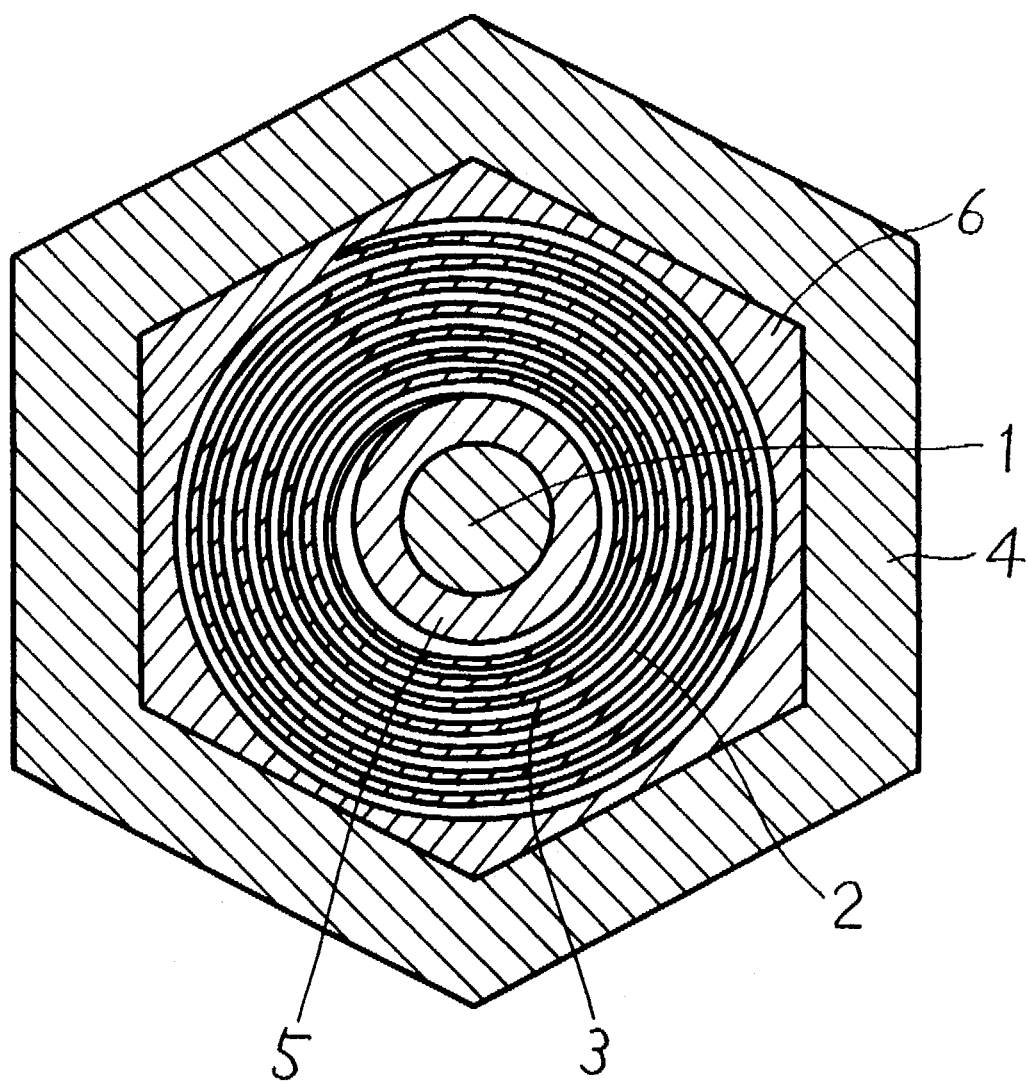
FIG. 1 is a sectional view showing the structure of a hexagonal segment formed by a jelly roll method.

FIG. 1 is a sectional view showing the structure of the hexagonal segment prepared in the aforementioned manner.

Referring to FIG. 1, this hexagonal segment is formed by a copper matrix 1 which is arranged on its center, an Nb sheet 2 and an Al sheet 3 which are alternately lap-wound on the matrix 1, and a copper matrix 4 which is formed around the same. The copper matrices 1 and 4 serve as stabilizing materials. In boundaries between the winding which is formed by alternately lap-winding the Nb and Al sheets 2 and 3 and the copper matrices 1 and 4 which are arranged on the center and the outer periphery of the winding, only the Nb sheet 2 is wound to define diffusion barrier layers 5 and 6 respectively.

520 such hexagonal segments were collected and inserted in a copper pipe and subjected to a wire drawing step with extrusion and drawing, a twisting step and a forming step, thereby preparing a Cu/Nb/Al composite multifilamentary wire having a section of 1.29 mmφ.

Figure 2:
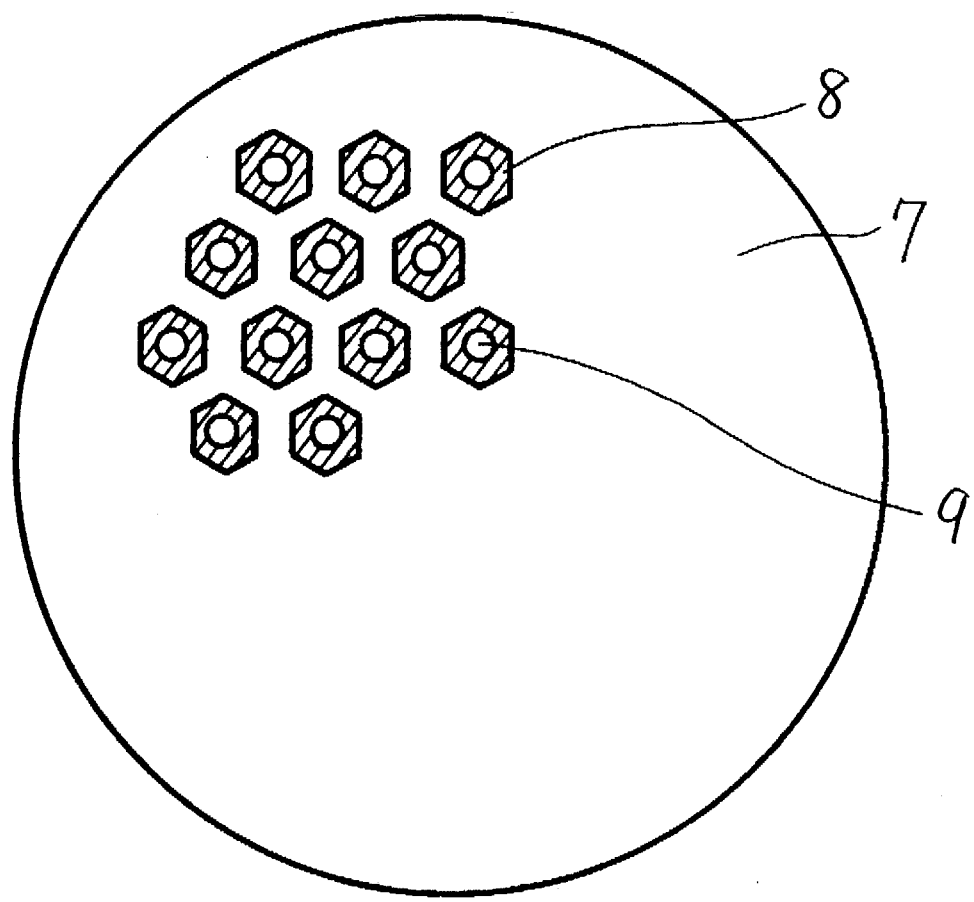
FIG. 2 is a sectional view schematically showing the structure of a Cu/Nb/Al composite multifilamentary wire.

FIG. 2 is a sectional view schematically showing the structure of the Cu/Nb/Al composite multifilamentary wire obtained in the aforementioned manner.

Referring to FIG. 2, this composite multifilamentary wire is formed by a stabilizing material 7 consisting of copper and a number of filaments 8 which are embedded therein. A stabilizing material 9 consisting of copper is arranged in the center of each filament 8.

The composite multifilamentary wire obtained in the aforementioned manner was heat treated according to the present invention, to prepare an $Nb_3Al$ superconducting multifilamentary wire. This heat treatment step is now described in detail with reference to FIG. 3.

Figure 3:
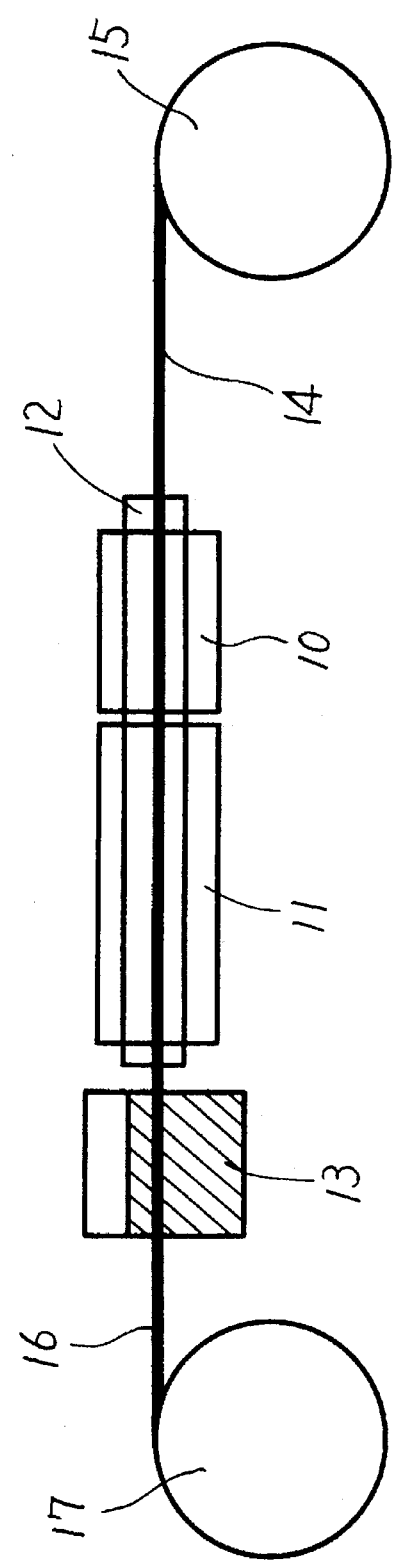
FIG. 3 is a sectional view showing an exemplary apparatus for preparing an $Nb_3Al$ superconducting wire according to the present invention.

FIG. 3 is a sectional view showing an exemplary apparatus for preparing an $Nb_3Al$ superconducting wire according to the present invention.

Referring to FIG. 3, this apparatus is formed by a continuous heat treatment furnace (tubular electric furnace) 12 comprising a temperature increase zone 10 and a soaking zone 11, a cooling vessel 13, a supply reel 15 for feeding a composite multifilamentary wire 14 into the continuous heat treatment furnace 12, and a take-up reel 17 for taking up an $Nb_3Al$ superconducting wire 16 which is obtained by passing the composite multifilamentary wire 14 through the cooling vessel 13.

The Cu/Nb/Al composite multifilamentary wire 14 obtained in the aforementioned manner was passed through the temperature increase zone 10 by the supply reel 15. The composite multifilamentary wire 14 was passed through the temperature increase zone 10 for 30 seconds, to be heated from the room temperature up to 900° C. Then, the composite multifilamentary wire 14 was passed through the soaking zone 11 of 900° C. for 1 minute, to be held at the temperature of 900° C. for 1 minute. During this heating, the tubular electric furnace 12 comprising the temperature increase zone 10 and the soaking zone 11 was brought into a nitrogen atmosphere, for passing the composite multifilamentary wire 14 therethrough. Then, the heated wire 14 was passed through the cooling vessel 13 for 30 seconds, to be cooled to the room temperature, and thereafter taken up on the take-up reel 17.

The wire treated in the aforementioned manner was further heat treated in a vacuum electric furnace at 750° C. for 50 hours, thereby obtaining an $Nb_3Al$ superconducting wire.

EXAMPLE 2

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 1 minute, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 3

The Cu/Nb/Al composite multifilamentary wire described in Example 1 was passed through the tubular electric furnace 12 under a nitrogen atmosphere and the cooling vessel 13 similarly to Example 1, except heating conditions. The composited multifilamentary wire was passed through the temperature increase zone 10 for 1 minute to be heated up to 1050° C. in 1 minute, held at this temperature in the soaking zone 11 for 1 minute, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 4

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 2 minutes to be heated up to 1050° C. in 2 minutes, held at this temperature in the soaking zone 11 for 1 minute, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 5

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 2 minutes, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 6

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 5 minutes, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 7

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 10 minutes, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 8

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 20 minutes, and thereafter passed through the cooling vessel 13, to be cooled to the room temperature in 30 seconds.

The wire treated in the aforementioned manner was further heat treated in a vacuum electric furnace at 750° C. for 50 hours similarly to Example 1, to obtain an $Nb_3Al$ superconducting wire.

EXAMPLE 9

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 1 minute, and thereafter passed through the cooling vessel 13, to be cooled to the room temperature in 1 minute.

The wire treated in the aforementioned manner was further heat treated in a vacuum electric furnace at 750° C. for 50 hours similarly to Example 1, to obtain an $Nb_3Al$ superconducting wire.

EXAMPLE 10

The Cu/Nb/Al composite multifilamentary wire described in Example 1 was passed through the tubular electric furnace 12 under a nitrogen atmosphere and the cooling vessel 13 similarly to Example 1, except heating conditions. The composite multifilamentary wire was passed through the temperature increase zone 10 for 30 seconds to be heated up to 1050° C. in 30 seconds, held at this temperature in the soaking zone 11 for 1 minute, and thereafter passed through the cooling vessel 13, to be cooled to the room temperature in 2 minutes.

The wire treated in the aforementioned manner was further heat treated in a vacuum electric furnace at 750° C. for 50 hours similarly to Example 1, to obtain an $Nb_3Al$ superconducting wire.

EXAMPLE 11

The Cu/Nb/Al composite multifilamentary wire described in Example 1 was passed through the tubular electric furnace 12 under a nitrogen atmosphere and the cooling vessel 13 similarly to Example 1, under the same heating conditions. The composite multifilamentary wire was passed through the temperature increase zone 10 to be heated up to 900° C. in 30 seconds, held at this temperature in the soaking zone 11 for 1 minute, and thereafter passed through the cooling vessel 13, to be cooled to the room temperature in 30 seconds. Thereafter three such wires were stranded up at a strand pitch of 30 mm.

The stranded wire obtained in the aforementioned manner was further heat treated in a vacuum electric furnace at 750° C. for 50 hours similarly to Example 1, to obtain an $Nb_3Al$ superconducting stranded wire.

EXAMPLE 12

The Cu/Nb/Al composite multifilamentary wire described in Example 1 was passed through the tubular electric furnace 12 under a nitrogen atmosphere and the cooling vessel 13 similarly to Example 1, under the same heating conditions as those in Example 2. The composite multifilamentary wire was passed through the temperature increase zone 10 to be heated up to 1050° C. in 30 seconds, held at this temperature in the soaking zone 11 for 1 minute, and thereafter passed through the cooling vessel 13, to be cooled to the room temperature in 30 seconds. Thereafter three such wires were stranded up at a strand pitch of 30 mm.

The stranded wire obtained in the aforementioned manner was further heat treated in a vacuum electric furnace at 750° C. for 50 hours similarly to Example 1, to obtain an $Nb_3Al$ superconducting stranded wire.

EXAMPLE 13

Three Cu/Nb/Al composite multifilamentary wires described in Example 1 were stranded up at a strand pitch of 30 mm, to prepare a composite stranded wire. This composite stranded wire was passed through the tubular electric furnace 12 under a nitrogen atmosphere similarly to Example 1, under the same heating conditions. Namely, the stranded wire was passed through the temperature increase zone 10 to be heated up to 900° C. in 30 seconds, held at this temperature in the soaking zone 11 for 1 minute, and thereafter passed through the cooling vessel 13, to be cooled to the room temperature in 30 seconds.

The stranded wire treated in the aforementioned manner was further heat treated in a vacuum electric furnace at 750° C. for 50 hours similarly to Example 1, to obtain an $Nb_3Al$ superconducting stranded wire.

EXAMPLE 14

Three Cu/Nb/Al composite multifilamentary wires described in Example 1 were stranded up at a strand pitch of 30 mm, to prepare a composite stranded wire. This composite stranded wire was passed through the tubular electric furnace 12 under a nitrogen atmosphere similarly to Example 1, under the same heating conditions as those in Example 2. Namely, the stranded wire was passed through the temperature increase zone 10 to be heated up to 1050° C. in 30 seconds, held at this temperature in the soaking zone 11 for 1 minute, and thereafter passed through the cooling vessel 13, to be cooled to the room temperature in 30 seconds.

The stranded wire treated in the aforementioned manner was further heat treated in a vacuum electric furnace at 750° C. for 50 hours similarly to Example 1, to obtain an $Nb_3Al$ superconducting stranded wire.

Comparative Example

Three Cu/Nb/Al composite multifilamentary wires described in Example 1 were stranded up at a strand pitch of 30 mm, to prepare a composite stranded wire. This composite stranded wire was heat treated in a vacuum electric furnace at 800° C. for 10 hours, to obtain an $Nb_3Al$ superconducting stranded wire.

Evaluation

The $Nb_3Al$ superconducting wires and the $Nb_3Al$ superconducting stranded wires according to Examples 1 to 14 and comparative example were subjected to measurement of critical current densities of non-copper portions at 4.2 K and 12 T and upper critical magnetic field at 4.2 K. Table 1 shows the results.

TABLE 1

|  | Critical current Density | Upper Critical Magnetic Field (4.2K) |
| --- | --- | --- |
| Example 1 | 680 A/mm$^2$ | 21.5 T |
| Example 2 | 850 A/mm$^2$ | 22 T |
| Example 3 | 780 A/mm$^2$ | 21.8 T |
| Example 4 | 740 A/mm$^2$ | 21.6 T |
| Example 5 | 790 A/mm$^2$ | 22 T |
| Example 6 | 680 A/mm$^2$ | 22 T |
| Example 7 | 530 A/mm$^2$ | 21.8 T |
| Example 8 | 320 A/mm$^2$ | 21.5 T |
| Example 9 | 820 A/mm$^2$ | 21.9 T |
| Example 10 | 780 A/mm$^2$ | 21.7 T |
| Example 11 | 550 A/mm$^2$ | 21.5 T |
| Example 12 | 710 A/mm$^2$ | 22 T |
| Example 13 | 650 A/mm$^2$ | 21.5 T |
| Example 14 | 820 A/mm$^2$ | 22 T |
| Comparative Example | 490 A/mm$^2$ | 20 T |

It is clearly understood from Table 1 that the Nb$_3$Al superconducting wires and the Nb$_3$Al superconducting stranded wires of Examples 1 to 14 according to the present invention have higher critical current densities as compared with the Nb$_3$Al superconducting stranded wire of comparative example.

While the above description has been made with reference to only a stranded wire, the present invention is also applicable to manufacturing of a coil. Namely, it is possible to manufacture an Nb$_3$Al superconducting coil having a high critical current density by coiling an Nb$_3$Al superconducting wire which is prepared according to the present invention and thereafter heat treating the same at a low temperature for a long time.

According to the present invention, as hereinabove described, it is possible to prepare an Nb$_3$Al superconducting wire and an Nb$_3$Al superconducting stranded wire having uniform characteristics along overall lengths of the wire and the strands respectively with high critical current densities. Thus, the present invention is also applicable to manufacturing of a large-sized conductor or coil.

According to the present invention, further, no wire breaking is caused since it is not necessary to apply severe working on the wire. Thus, the present invention is effective for elongation of the wire, with improvement in productivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an Nb$_3$Al superconducting wire, comprising the steps in the following order:

passing an Nb/Al composite wire consisting of an Nb metal or an Nb alloy and an Al metal or an Al alloy through a furnace for heating the same from the room temperature to a prescribed temperature;

passing said heated Nb/Al composite wire through said furnace for holding the same at said prescribed temperature, wherein said steps of heating and holding said Nb/Al composite wire is to form Nb$_3$Al superconductivity; and passing said Nb/Al composite wire, being held at said prescribed temperature, further through a cooling part for cooling the same from said prescribed temperature to the room temperature in a short time to maintain the Nb$_3$Al superconductivity, said step of heating said Nb/Al composite wire, said step of holding the same at said prescribed temperature and said step of passing the same through said cooling part being continuously carried out by continuously moving said Nb/Al composite wire.

2. A method of preparing an Nb$_3$Al superconducting wire in accordance with claim 1, wherein each of the time for heating said Nb/Al composite wire and the time for passing the same through said cooling part is within 1 minute.

3. A method of preparing an Nb$_3$Al superconducting wire in accordance with claim 1, wherein said prescribed temperature is at least 800° C., and the time for holding said Nb/Al composite wire at said prescribed temperature is within 10 hours.

4. A method of preparing an Nb$_3$Al superconducting wire in accordance with claim 1, wherein each of the time for heating said Nb/Al wire and the time for passing the same through said cooling part is within 2 minutes, said prescribed temperature is at least 900° C., and the time for holding said Nb/Al wire at said prescribed temperature is within 10 minutes.

5. A method of preparing an Nb$_3$Al superconducting wire in accordance with claim 1, further comprising a step of heating said Nb/Al composite wire, being passed through said cooling part, at a temperature of not more than 800° C. for at least 10 hours.

6. A method of preparing an Nb$_3$Al superconducting wire in accordance with claim 1, wherein said Nb/Al composite wire is composited with copper or a copper alloy for stabilization.

7. A method of preparing an Nb$_3$Al superconducting wire in accordance with claim 1, wherein said Nb/Al composite wire is prepared by a jelly roll method.

8. A method of preparing an Nb$_3$Al superconducting wire in accordance with claim 7, wherein an Nb layer in the filament of said Nb/Al composite wire has a thickness of not more than 500 nm.

9. A method of preparing an Nb$_3$Al superconducting stranded wire, comprising the steps in the following order:

passing an Nb/Al composite stranded wire, being formed by stranding up a plurality of Nb/Al composite wires each consisting of an Nb metal or an Nb alloy and an Al metal or an Al alloy, through a furnace for heating the same from the room temperature to a prescribed temperature;

passing said heated Nb/Al composite stranded wire through said furnace for holding the same at said prescribed temperature, wherein said steps of heating and holding the Nb/Al composite is to form Nb$_3$Al superconductivity; and passing said Nb/Al composite stranded wire, being held at said prescribed temperature, further through a cooling part for cooling the same from said prescribed temperature to the room temperature in a short time to maintain the Nb$_3$Al superconductivity, said step of heating said Nb/Al composite stranded wire, said step of holding the same at said prescribed temperature and said step of passing the same through said cooling part being continuously carried out by continuously moving said Nb/Al composite stranded wire.

10. A method of preparing an $Nb_3Al$ superconducting stranded wire in accordance with claim 9, wherein each of the time for heating said Nb/Al composite stranded wire and the time for passing the same through said cooling part is within 1 minute.

11. A method of preparing an $Nb_3Al$ superconducting stranded wire in accordance with claim 9, wherein said prescribed temperature is at least 800° C., and the time for holding said Nb/Al composite stranded wire at said prescribed temperature is within 10 hours.

12. A method of preparing an $Nb_3Al$ superconducting stranded wire, comprising the steps in the following order:

passing an Nb/Al composite wire consisting of an Nb metal or an Nb alloy and an Al metal or an Al alloy through a furnace for heating the same from the room temperature to a prescribed temperature;

passing said heated Nb/Al composite wire through said furnace for holding the same at said prescribed temperature, wherein said steps of heating and holding said Nb/Al composite wire is to form $Nb_3Al$ superconductivity;

passing said Nb/Al composite wire, being held at said prescribed temperature, further through a cooling part for cooling the same from said prescribed temperature to the room temperature in a short time to maintain the $Nb_3Al$ superconductivity; and collecting and stranding up a plurality of said Nb/Al composite wires being passed through said cooling part, said step of heating said Nb/Al composite wire, said step of holding the same at said prescribed temperature and said step of passing the same through said cooling part being continuously carried out by continuously moving said Nb/Al composite wire.

13. A method of preparing an $Nb_3Al$ superconducting stranded wire in accordance with claim 12, wherein each of the time for heating said Nb/Al composite wire and the time for passing the same through said cooling part is within 1 minute.

14. A method of preparing an $Nb_3Al$ superconducting stranded wire in accordance with claim 12, wherein said prescribed temperature is at least 800° C., and the time for holding said Nb/Al composite wire at said prescribed temperature is within 10 hours.

15. A method of preparing an $Nb_3Al$ superconducting stranded wire in accordance with claim 12, further comprising a step of heating said Nb/Al composite wires as stranded up at a temperature of not more than 800° C. for at least 10 hours.

* * * * *